United States Patent
Nakatani et al.

[11] Patent Number: 5,977,892
[45] Date of Patent: Nov. 2, 1999

[54] OFFSET CANCELLATION CIRCUIT

[75] Inventors: Yuichi Nakatani; Satoshi Takahashi; Masami Aiura, all of Sendai, Japan

[73] Assignee: Motorola, Inc., Schaumburg, Ill.

[21] Appl. No.: 08/648,645

[22] Filed: May 16, 1996

[30] Foreign Application Priority Data

May 31, 1995 [JP] Japan .................................. 7-158467

[51] Int. Cl.⁶ .................................................. H03M 1/06
[52] U.S. Cl. ........................ 341/118; 327/391; 327/437
[58] Field of Search ........................... 341/118; 327/365, 327/391, 437

[56] References Cited

U.S. PATENT DOCUMENTS

| | | | |
|---|---|---|---|
| 4,599,522 | 7/1986 | Matsuo et al. | 307/576 |
| 4,651,037 | 3/1987 | Ogasawara et al. | 307/572 |
| 5,019,731 | 5/1991 | Kobayashi | 307/571 |
| 5,479,121 | 12/1995 | Shen et al. | 327/94 |
| 5,517,150 | 5/1996 | Okumura | 327/427 |

FOREIGN PATENT DOCUMENTS 170119  6/1983  Japan .

*Primary Examiner*—Jeffrey A. Gaffin
*Assistant Examiner*—Jason L W Kost
*Attorney, Agent, or Firm*—Robert D. Atkins

[57] ABSTRACT

An offset cancellation circuit(1) for an analog switch(10) is provided which substantially reduces the offset voltage induced by the analog switch circuit. The circuit(1) comprising a second P-channel transistor(2) and a third N-channel transistor(4) connected to each other in series, the drains of the second P-channel transistor and the third N-channel transistor being connected to the output terminal; a second N-channel transistor(3) and a third P-channel transistor(5) connected to each other in series, the drains of the second N-channel transistor and the third P-channel transistor being connected to the output terminal; the gate of the second P-channel transistor is connected to the gate of the N-channel transistor; and the gate of the second N-channel transistor is connected to the gate of the P-channel transistor.

3 Claims, 1 Drawing Sheet

OFFSET CANCELLATION CIRCUIT

FIELD OF THE INVENTION

The present invention relates to an offset cancellation circuit for an analog switch, which provides accurate distribution and transfer of charge for the analog switch circuit.

BACKGROUND OF THE INVENTION

Recently, an analog switch circuit has been increasingly used in A/D converters, D/A converters, and sample-and-hold circuits, for example; such an analog switch circuit is generally formed in small shape in order to increase controllability and characteristics, or to minimize power consumption.

With the analog switch circuit, there exists an offset voltage; when the offset voltage is high, the operating point of the switch varies, thus adversely affecting the accuracy of the A/D converters, D/A converters, and sample-and-hold circuits that employ the analog switch circuit.

So, the analog switch circuit typically includes an additional offset cancellation circuit for canceling the offset voltage generated by the analog switch circuit.

Conventionally, an offset cancellation circuit 10 as shown in FIG. 3 exists as an offset cancellation circuit for an analog switch to cancel the offset voltage of the analog switch circuit.

FIG. 3 is a circuit diagram depicting a prior art offset cancellation circuit 20 applied to the analog switch circuit 10.

In FIG. 3, the analog switch 10 comprises an N-channel MOS transistor 11 and a P-channel MOS transistor 12 that input drive signals ø and ˜˜˜ø (an inverted version of the drive signal ø is hereinafter referred to as ˜˜˜ø) to their gate terminals, respectively.

The offset cancellation circuit 20 comprises a P-channel MOS transistor 21 having approximately half the size of the P-channel MOS transistor that comprises the analog switch circuit 10, and an N-channel MOS transistor 22 having approximately half the size of the N-channel MOS transistor 11 that comprises the analog switch circuit 10.

The P-channel MOS transistor 21 having its gate terminal connected commonly to the gate terminal of the N-channel MOS transistor 11 of the analog switch circuit 10, and having its source and drain terminals connected to each other and also connected to an output terminal of the analog switch circuit 10; similarly, the N-channel MOS transistor 22 has its gate terminal connected commonly to the gate terminal of the P-channel MOS transistor 12 of the analog witch circuit 10, and having its source and drain terminals connected to each other and also connected to the output terminal of the analog switch circuit 10.

So configured, when a logic high ("H") is applied to the analog switch circuit 10 as the drive signal ø, a "H" is applied to the gate terminal of the N-channel MOS transistor 11, while a logic low ("L") is applied to the gate terminal of the P-channel MOS transistor 12, so the analog switch circuit 10 turns on, causing the voltage signal inputted from the input terminal Vin to be outputted at the output terminal Vout. When a "L" is outputted to the analog switch circuit 10 as the drive signal ø, a "L" is applied to the gate terminal of the N-channel MOS transistor 11, while a "H" is applied to the gate terminal of the P-channel MOS transistor 12, so the analog switch circuit 10 turns off.

Here, for the offset voltage components induced by variations in input voltage of the analog switch circuit 10, an offset voltage component caused by the N-channel MOS transistor 11 is absorbed by capacitance of the N-channel MOS transistor 22, while an offset voltage component caused by the P-channel MOS transistor 12 is absorbed by capacitance of the P-channel MOS transistor 21. Thus, the offset voltage generated in the analog switch circuit 10 can be reduced.

However, with such an offset cancellation circuit for an analog switch, the offset voltage might be reduced, but the cancellation of the offset voltage is insufficient for some applications, so there is a need for further reduction in offset voltage.

A specific example is discussed below with reference to FIG. 4.

FIG. 4 is a schematic circuit diagram depicting a comparator portion in an A/D converter for explaining the problem of the prior art example, where it is assumed that the reference voltage margin is 2 V and applied to an analog switch circuit in a 10-bit A/D converter.

Recently, equipment that handles high-quality image data, such as HDTV (High Definition Television) and portable camcorders, demands higher resolution and more sophisticated image data processing; for such apparatus that handle high resolution of image data, more sophisticated A/D converters, more specifically, A/D converters with about 10 bits (=1024) of accuracy, are required.

That is, with the A/D converter as described above, in order to secure 10 bits of accuracy, the voltage steps divided by resistance R are less than 2 mV (2 V divided by 1024), which means that if an offset voltage greater than that occurs, 10 bits of accuracy could not be secured. Especially, in the example shown in FIG. 4, the offset voltage of the analog switch circuit used at the input terminal of the comparator 30 is found to affect the overall characteristics.

However, the prior art offset cancellation circuit 20 for the analog switch cancels the offset voltage insufficiently, so an offset voltage of about up to ±8 mV is present, as shown in FIG. 2. This could merely secure 8 bits of accuracy, thus preventing use in high-accuracy circuits.

Accordingly, it is an object of the present invention to provide an offset cancellation circuit for an analog switch that substantially reduces the offset voltage induced by the analog switch circuit.

Operation

If an offset voltage occurs in the N-channel MOS transistors that comprise the analog switch circuit, the offset voltage is absorbed by the second P-channel MOS transistor, and the absorption of the offset voltage is enhanced by the third P-channel MOS transistor; similarly, if an offset voltage occurs in the P-channel MOS transistors that comprise the analog switch circuit, the offset voltage is absorbed by the second N-channel MOS transistor, and the absorption of the offset voltage is enhanced by the third N-channel MOS transistor.

In other words, upon occurrence of an offset voltage induced by each MOS transistor in the analog switch circuit, the MOS transistor of the same channel plays a supplemental role in absorbing the offset voltage in a well-balanced manner.

DETAILED DESCRIPTION OF THE INVENTION

One preferred embodiment of the present invention is described below with reference to FIGS. 1 and 2. First of all, the conFIGuration of the present embodiment is described.

Figure 1:
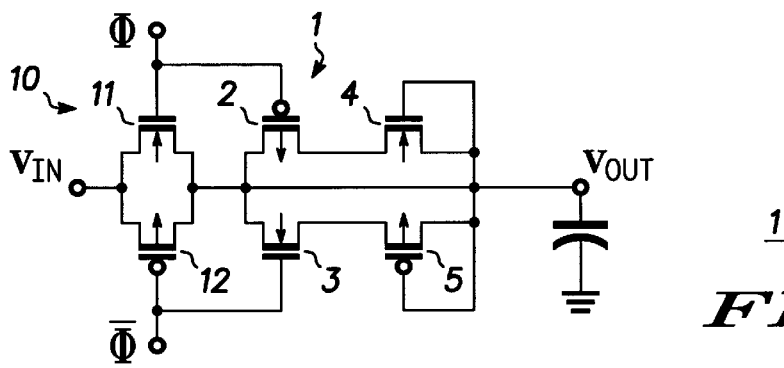
FIG. 1 is a circuit diagram depicting an offset cancellation circuit for an analog switch according to one embodiment of the present invention.
Figure 3:
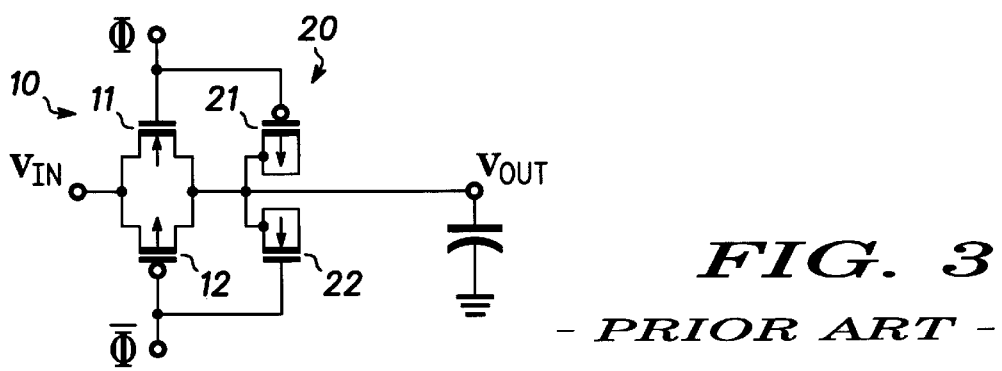
FIG. 3 is a circuit diagram depicting a prior art offset cancellation circuit for an analog switch.
Figure 4:
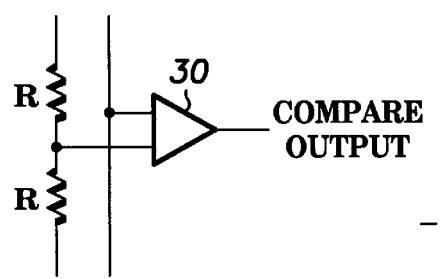
FIG. 4 is a schematic circuit diagram depicting a comparator portion in the A/D converter for explaining the problem of the prior art example.

FIG. 1 is a circuit diagram depicting an offset cancellation circuit 1 for an analog switch according to one embodiment of the present invention. It should be appreciated that like parts in FIG. 1 is denoted by the same reference symbol for the like parts in FIG. 3.

The offset cancellation circuit 1 for the analog switch according to the present embodiment comprises two pairs of P-channel MOS transistors 2, 5 and N-channel MOS transistors 3, 4; source terminals of an N-channel MOS transistor 11 and a P-channel MOS transistor 12 are connected to each other to form an input terminal Vin, while drain terminals of the N-channel MOS transistor 11 and P-channel transistor 12 are connected to each other to form an output terminal Vout; thus, the circuit 1 is provided for the analog switch 10 that turns on and off according to a control signal ø, ˜˜˜ø applied to each gate terminal.

The second P-channel MOS transistor 2 has its gate terminal connected commonly to the gate terminal of the N-channel MOS transistor 11, thus receiving the control signal ø at its gate terminal; it also has its drain and source terminals connected to each other and also connected to the output terminal of the analog switch circuit 10; this node is connected to a source terminal of a third N-channel MOS transistor 4 described later.

The second N-channel MOS transistor 3 has its gate terminal connected commonly to the gate terminal of the P-channel MOS transistor 12, thus receiving the inverted control signal ˜˜˜ø at its gate terminal; it also has its drain and source terminal connected to each other and also connected to the output terminal of the analog switch circuit 10; this node is connected to a source terminal of a third P-channel MOS transistor 5 described later.

The third N-channel MOS transistor 4 has its source terminal connected to the source terminal of the second P-channel MOS transistor 2, and has its gate and drain terminals connected to each other, a node of which is connected to the output terminal of the analog switch circuit 10. The third P-channel MOS transistor 5 has its source terminal connected to the source terminal of the second N-channel MOS transistor 3, and has its gate and drain terminal connected to each other, a node of which is connected to the output terminal of the analog switch circuit 10.

The second P-channel MOS transistor 2 and second N-channel MOS transistor 3 in the present embodiment are formed so that their size is one-half the size of the MOS transistors 11 and 12 in the analog switch circuit 10; the third N-channel MOS transistor 4 and third P-channel MOS transistor 5 are also formed so that their size is one-half the size of the second P-channel MOS transistor 2 and second N-channel MOS transistor 3.

Thus, the MOS transistor size ratio for the analog switch circuit 10, second MOS transistors 2, 3, and third MOS transistors 4, 5 is 4:2:1.

The operation of the present embodiment is described below with reference to FIG. 2.

Figure 2:
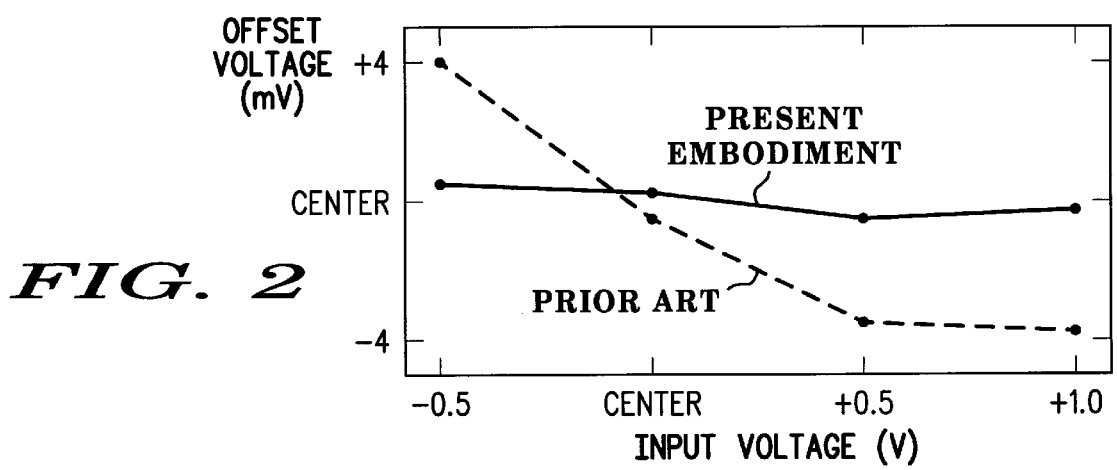
FIG. 2 is an illustration depicting operational characteristics of the offset cancellation circuit for an analog switch according to one embodiment of the present invention.

FIG. 2 is an illustration depicting operational characteristics of the offset cancellation circuit for an analog switch according to one embodiment of the present invention, with operational characteristics of an prior art offset cancellation circuit for an analog switch also illustrated for purposes of comparison.

Now, turning to the offset cancellation characteristics of the prior art offset cancellation circuit in FIG. 2, it can be seen that when the input voltage Vin shifts to negative quantity, the offset voltage moves to positive quantity, and vice versa.

This suggests that for the prior example, the nearer the threshold voltage Vtn of the N-channel MOS transistor is the input voltage Vin, the greater the offset voltage of the N-channel MOS transistor, while the nearer the threshold voltage Vtp of the P-channel MOS transistor is the input voltage Vin, the greater the offset voltage of the P-channel MOS transistor.

In other words, in the prior example, because the absorption of the offset voltage by each MOS transistor in the analog switch circuit 10 is only implemented by MOS transistors of different channels, Δ Vnoff>Δ Vpoff holds true (where Δ Vnoff is the offset voltage of the N-channel MOS transistor 11, and ø Vpoff is the offset voltage of the P-channel MOS transistor 12) when the input voltage Vin is nearly equal to the threshold voltage Vtn of the N-channel MOS transistor 11; on the other hand, Δ Vnoff<Δ Vpoff holds true when the input voltage Vin is nearly equal to the threshold voltage Vtp of the P-channel MOS transistor 12.

With the afore-described problem of the prior art example in mind, the present embodiment is intended to shift the offset voltage to negative quantity when the input voltage Vin shifts to negative quantity, and to shift the offset voltage to positive quantity when the input voltage Vin shifts to positive quantity, thereby enhancing the offset voltage cancellation characteristics.

More specifically, when the input voltage Vin is nearly equal to the threshold voltage Vtn of the N-channel MOS transistor 11, the second P-channel MOS transistor 2 contributes significantly to the cancellation of the offset voltage; then, by reducing the second P-channel MOS transistor 2's absorption through the third P-channel MOS transistor 5, |Δ Vn−(Δ Vn1+Δ Vp2) |=|Δ Vp−Δ Vp1 | holds true, assuming that the offset voltages of the N-channel MOS transistor 11, P-channel MOS transistor 12, second P-channel MOS transistor 2, second N-channel MOS transistor 3, third N-channel MOS transistor 4, and third P-channel MOS transistor 5 are Δ Vn, Δ Vp, Δ Vp1, Δ Vn1, Δ Vn2, and Δ Vp2, respectively; similarly, when the input voltage Vin is nearly equal to the threshold voltage Vtp of the P-channel MOS transistor 12, the second N-channel MOS transistor 3 contributes significantly to the offset voltage cancellation; then, by reducing the second N-channel MOS transistor 3's absorption through the third N-channel MOS transistor 4, |Δ Vn−Δ Vn1 |=|Δ Vp+Δ Vn2 | holds true.

In this way, according to the present embodiment, the offset voltage can be absorbed in a well-balanced manner with respect to an input voltage Vin having a certain margin, so the offset voltage can be held to within a range of ±1 mV at most, as shown in FIG. 2.

Thus, an offset cancellation circuit for an analog switch can be provided which accommodate applications, such as 10-bit A/D converters, where severe characteristics are required.

It should be appreciated that in the above embodiment, the drain and source terminals of the second P-channel MOS transistor 2 and second N-channel MOS transistor 3 are connected to each other, although these drain and source may not be connected but may be left open; in that case, too, a similar effect to the above may be obtained.

The present invention offers an advantage that when an offset voltage caused by each MOS transistor of an analog switch circuit occurs, the offset voltage is not only absorbed by MOS transistors of a different channel, but the offset voltage can also be absorbed by MOS transistors of the same channel in a well-balanced manner regardless of the input voltage value; as a result, the offset voltage of the analog switch circuit can be reduced considerably.

What is claimed is:

1. An offset cancellation circuit (1) for canceling the offset voltage of an analog switch circuit(10), said analog switch circuit having N-channel(11) and P-channel(12) MOS transistors, source terminals of the N-channel and P-channel MOS transistors being connected to each other and forming an input terminal(Vin) of the switch circuit, and drain terminals of the N-channel and P-channel MOS transistors being connected to each other and forming an output terminal (Vout), said analog switch circuit turning on and off according to a control signal inputted into each gate terminal thereof, said offset cancellation circuit comprising:

a second P-channel MOS transistor(2) and a third N-channel MOS transistor(4) connected to each other in series each with a drain-source conduction path controlled by the respective gate terminal, the drain terminals of the second P-channel MOS transistor and the third N-channel MOS transistor being connected to the output terminal;

a second N-channel MOS transistor(3) and a third P-channel MOS transistor(5) connected to each other in series each with a drain-source conduction path controlled by the respective gate terminal, the drain terminals of the second N-channel MOS transistor and the third P-channel MOS transistor being connected to the output terminal;

the gate terminal of said second P-channel MOS transistor is connected to the gate terminal of said N-channel MOS transistor, and the gate terminal of said third N-channel MOS transistor is connected to the drain terminal of said third N-channel MOS transistor; and the gate terminal of said second N-channel MOS transistor is connected to the gate terminal of said P-channel MOS transistor, and the gate terminal of said third P-channel MOS transistor is connected to the drain terminal of said third P-channel MOS transistor.

2. An offset cancellation circuit of claim 1, wherein said second P-channel MOS transistor and said second N-channel MOS transistor have approximately half the size of said P-channel MOS transistor and said N-channel MOS transistor; and said third N-channel MOS transistor and said third P-channel MOS transistor have smaller sizes than those of said second P-channel MOS transistor and said second N-channel MOS transistor.

3. An offset cancellation circuit of claim 2, wherein said third P-channel MOS transistor and said third N-channel MOS transistor have approximately half the size of said second P-channel MOS transistor and said second N-channel MOS transistor.

* * * * *